US012644912B2

(12) United States Patent
　　Ansari

(10) Patent No.:　US 12,644,912 B2
(45) Date of Patent:　　Jun. 2, 2026

(54) ELECTRICAL ASSEMBLY

(71) Applicant: Lear Corporation, Southfield, MI (US)

(72) Inventor: Ajmal Imran Ansari, Canton, MI (US)

(73) Assignee: Lear Corporation, Southfield, MI (US)

( * ) Notice:　Subject to any disclaimer, the term of this patent is extended or adjusted under 35 U.S.C. 154(b) by 221 days.

(21) Appl. No.: 18/654,180

(22) Filed:　　May 3, 2024

(65)　　　　Prior Publication Data

US 2025/0341554 A1　　Nov. 6, 2025

(51) Int. Cl.
| | |
|---|---|
| *G01R 27/14* | (2006.01) |
| *G01K 3/00* | (2006.01) |
| *G01R 19/00* | (2006.01) |
| *G01R 19/10* | (2006.01) |
| *H02G 5/02* | (2006.01) |

(52) U.S. Cl.
　　CPC ............. *G01R 27/14* (2013.01); *G01K 3/005* (2013.01); *G01R 19/0023* (2013.01); *G01R 19/10* (2013.01); *H02G 5/02* (2013.01)

(58) Field of Classification Search
　　CPC ..... G01R 27/14; G01R 19/0023; G01R 19/10
　　See application file for complete search history.

(56)　　　　References Cited

U.S. PATENT DOCUMENTS

| | | |
|---|---|---|
| 3,737,982 A | 6/1973 | Calhoun |
| 5,640,077 A | 6/1997 | Gillissen |
| 2019/0165354 A1* | 5/2019 | Sylvester ............ H01M 10/425 |

FOREIGN PATENT DOCUMENTS

| | | |
|---|---|---|
| DE | 102016107707 B3 | 7/2017 |
| EP | 3352322 A1 | 7/2018 |

* cited by examiner

*Primary Examiner* — Alesa Allgood
(74) *Attorney, Agent, or Firm* — McGarry Bair PC

(57)　　　　ABSTRACT

An electrical assembly comprising a contactor including a first terminal and a second terminal; a first bus bar connected to the first terminal; a second bus bar connected to the second terminal; a first wire connected to the first terminal; a second wire connected to the second terminal; a third wire connected to the first bus bar or the first terminal; a fourth wire connected to the second bus bar or the second terminal; a first amplifier connected to the first wire and the third wire; and a second amplifier connected to the second wire and the fourth wire.

20 Claims, 7 Drawing Sheets

ELECTRICAL ASSEMBLY

TECHNICAL FIELD

The present disclosure generally relates to electrical assemblies, including electrical assemblies that can, for example, include contactors be utilized in connection with batteries and/or vehicles.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
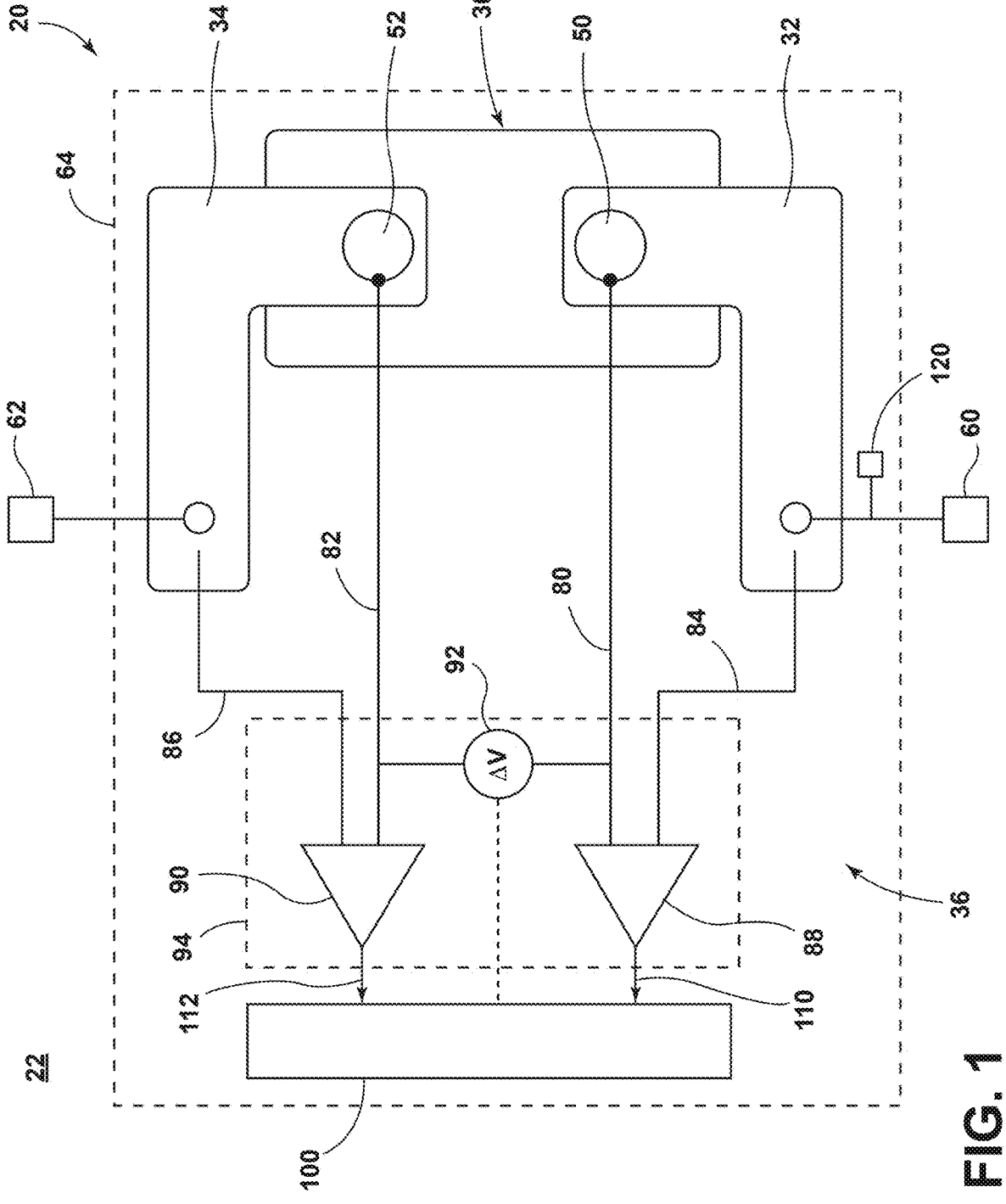
FIG. 1 is a schematic view generally illustrating an embodiment of an electrical assembly according to teachings of the present disclosure.

Referring to FIG. 1, a schematic view of an electrical assembly 20 is illustrated. The electrical assembly 20 includes a contactor 30, a first bus bar 32, a second bus bar 34, and a sensing assembly 36. The contactor 30 includes a first terminal 50 and a second terminal 52. The first terminal 50 and the second terminal 52 are power terminals and the contactor 30 can include separate control terminals. The first bus bar 32 is coupled with the first terminal 50. The second bus bar 34 is coupled with the second terminal 52. Operation of the contactor 30 selectively electrically connects the first terminal 50 with the second terminal 52 to electrically connect the first bus bar 32 with the second bus bar 34. Optionally, the electrical assembly 20 includes or is connected to a power source 60 (e.g., a battery) connected to the first bus bar 32 and an electrical load 62 (e.g., an electric motor) electrically connected to the second bus bar 34, and the contactor 30 selectively electrically connects the power source 60 with the electrical load 62. For example, the electrical assembly 20 can include a battery disconnect unit 64 including the contactor 30, the first bus bar 32, the second bus bar 34, and the sensing assembly 36. In some examples, a vehicle 22 includes the electrical assembly 20.

The contactor 30 connecting the first terminal 50 with the second terminal 52 allows electrical current to flow through the contactor 30, including the first terminal 50 and the second terminal 52, such as from the first bus bar 32 to the second bus bar 34 or from the second bus bar 34 to the first bus bar 32. The electrical current can increase the temperature of the contactor 30, the first bus bar 32, and the second bus bar 34. At least some of the highest temperatures can be at the first terminal 50 and the second terminal 52 of the contactor 30, and the sensing assembly 36 is configured to sense the temperature at the first terminal 50 and/or the second terminal 52. Temperatures above certain thresholds can indicate a fault (e.g., an overcurrent condition) has occurred or is imminent. Additionally or alternatively, the controller 100 can monitor and/or store sensed temperatures over time, such as to estimate degradation of the contactor 30, schedule maintenance, and/or predict a failure. Additionally or alternatively, the sensing assembly 36 is configured to sense a differential voltage across the first terminal 50 and the second terminal 52 for determining a contactor resistance of the contactor 30. The contactor resistance increasing or exceeding a threshold can indicate the contactor 30 has experienced a fault, a fault is imminent, and/or that the contactor 30 should be repaired or replaced.

The sensing assembly 36 includes a first wire 80, a second wire 82, a third wire 84, a fourth wire 86, a first amplifier 88, a second amplifier 90, and/or a voltage sensor 92. The electrical assembly 20 and/or the sensing assembly 36 can include an electronic controller 100. The first wire 80 is connected to the first terminal 50, the first amplifier 88, and/or the voltage sensor 92. The second wire 82 is connected to the second terminal 52, the second amplifier 90, and/or the voltage sensor 92. The third wire 84 is connected to the first bus bar 32, the first terminal 50, and/or the first amplifier 88. For example, the third wire 84 can be connected to the first bus bar 32 or the first terminal 50 and connected to the first amplifier 88. The fourth wire 86 is connected to the second bus bar 34, the second terminal 52, and/or the second amplifier 90. For example, the fourth wire 86 can be connected to the second bus bar 34 or the second terminal 52 and connected to the second amplifier 90. An output 110 of the first amplifier 88 is connected to the electronic controller 100. An output 112 of the second amplifier 90 is connected to the electronic controller 100. The first amplifier 88 and/or the second amplifier 90 can include an operational amplifier. Optionally, the first amplifier 88, the second amplifier 90, and/or the voltage sensor 92 are disposed on the same chip 94 (e.g., a microchip).

The first wire 80 and the second wire 82 comprise a copper-nickel alloy, such as constantan. The first terminal 50, the second terminal 52, the third wire 84, and the fourth wire 86 have a different material composition than the first wire 80 and the second wire 82. For example, the first terminal 50, the second terminal 52, the third wire 84, and the fourth wire 86 can comprise copper without nickel or with less nickel than the copper-nickel alloy of the first wire 80 and the second wire 82, but can comprise one or more other materials and can comprise different materials from each other. The first bus bar 32 includes the same material as the third wire 84. The second bus bar 34 includes the same material as the fourth wire 86. Optionally, the first bus bar 32, the second bus bar 34, the third wire 84, and the fourth wire 86 are copper. The first wire 80 connected to the first terminal 50 forms a first hot junction of a first thermoelectric generator. The first wire 80 and the third wire 84 connected to the first amplifier 88 form a first cold junction of the first thermoelectric generator. A first voltage generated at the first cold junction is proportional to a first temperature differential between the first hot junction and the first cold junction. The first amplifier 88 amplifies the first voltage and the electronic controller 100 determines a first temperature of the first terminal 50 according to the amplified first voltage. For example, the electronic controller 100 can include and/or access a look-up table to convert the amplified voltage to the first temperature. The look-up table can, for example, be created and/or modified during calibration of the electrical assembly 20.

The second wire 82 connected to the second terminal 52 forms a second hot junction of a second thermoelectric generator. The second wire 82 and the fourth wire 86 connected to the second amplifier 90 for a second cold junction of the second thermoelectric generator. A second voltage generated at the second cold junction is proportional to a second temperature differential between the second hot junction and the second cold junction. The second amplifier 90 amplifies the second voltage and the electronic controller 100 determines a second temperature of the second terminal 52 according to the amplified second voltage.

The voltage sensor 92 is connected to the first wire 80 and the second wire 82 to sense a differential voltage (e.g., a third voltage) across the first terminal 50 and the second terminal 52. The electronic controller 100 is connected to the voltage sensor 92 to obtain the differential voltage. The electronic controller 100 can utilize the differential voltage to determine a contactor resistance of the contactor 30. The electronic controller 100 obtains a contactor current from a current sensor 120 and/or another source (e.g., an onboard battery charger, an external battery charger, etc.). The current sensor 120 can be electrically connected to or disposed proximate (e.g., as a Hall effect sensor) the first bus bar 32 or the second bus bar 34. The electronic controller 100 can, for example, determine the contactor resistance as the differential voltage divided by the contactor current. The electronic controller 100 can compare the contactor resistance to one or more contactor resistance thresholds, such as to monitor the health of the contactor 30. Increasing contactor resistance or the contactor resistance that exceeds the one or more thresholds can indicate the contactor 30 should be repaired or replaced as a contactor fault may have occurred or be imminent.

Figure 2:
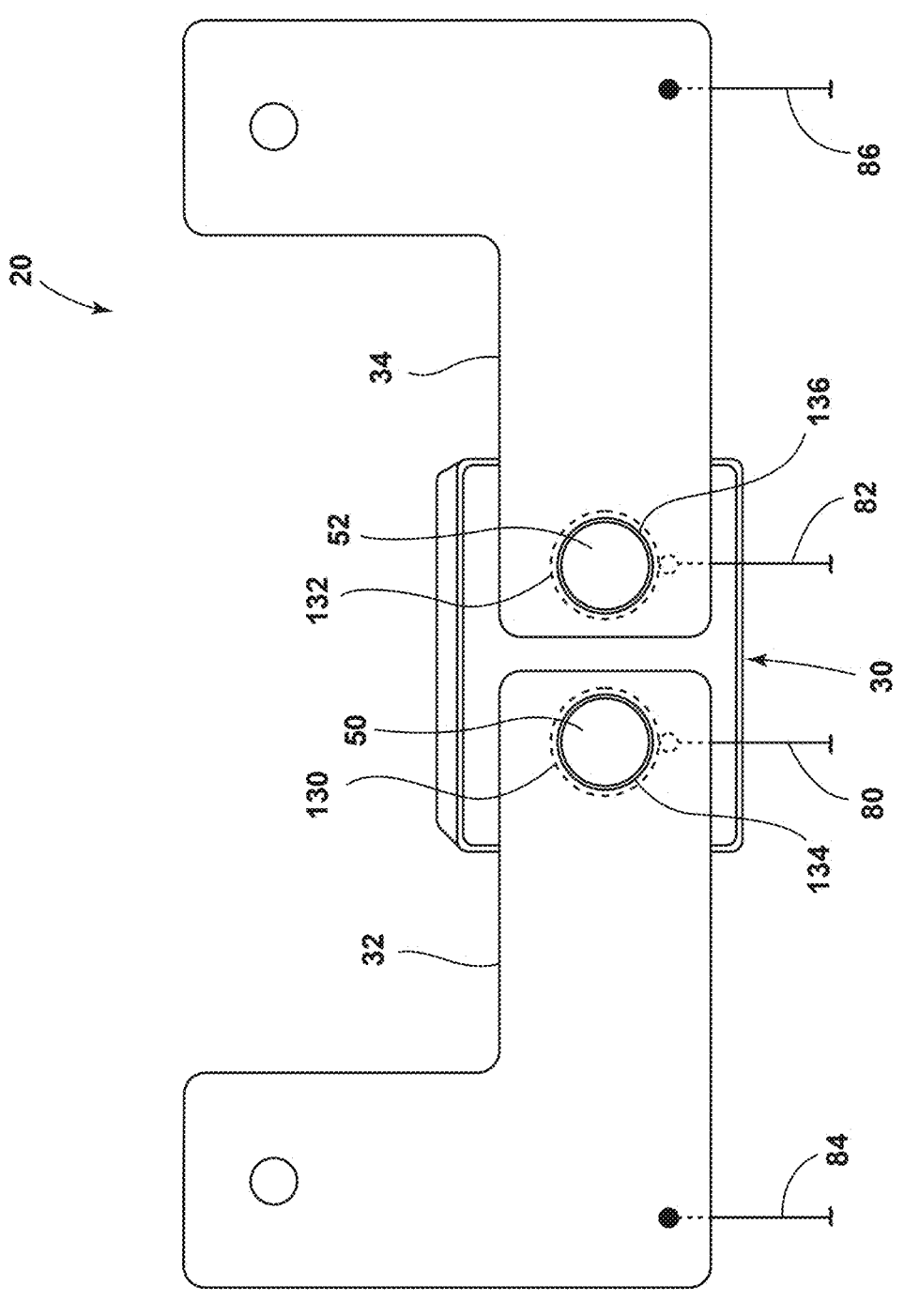
FIG. 2 is a top view generally illustrating portions of an embodiment of an electrical assembly according to teachings of the present disclosure.
Figure 3:
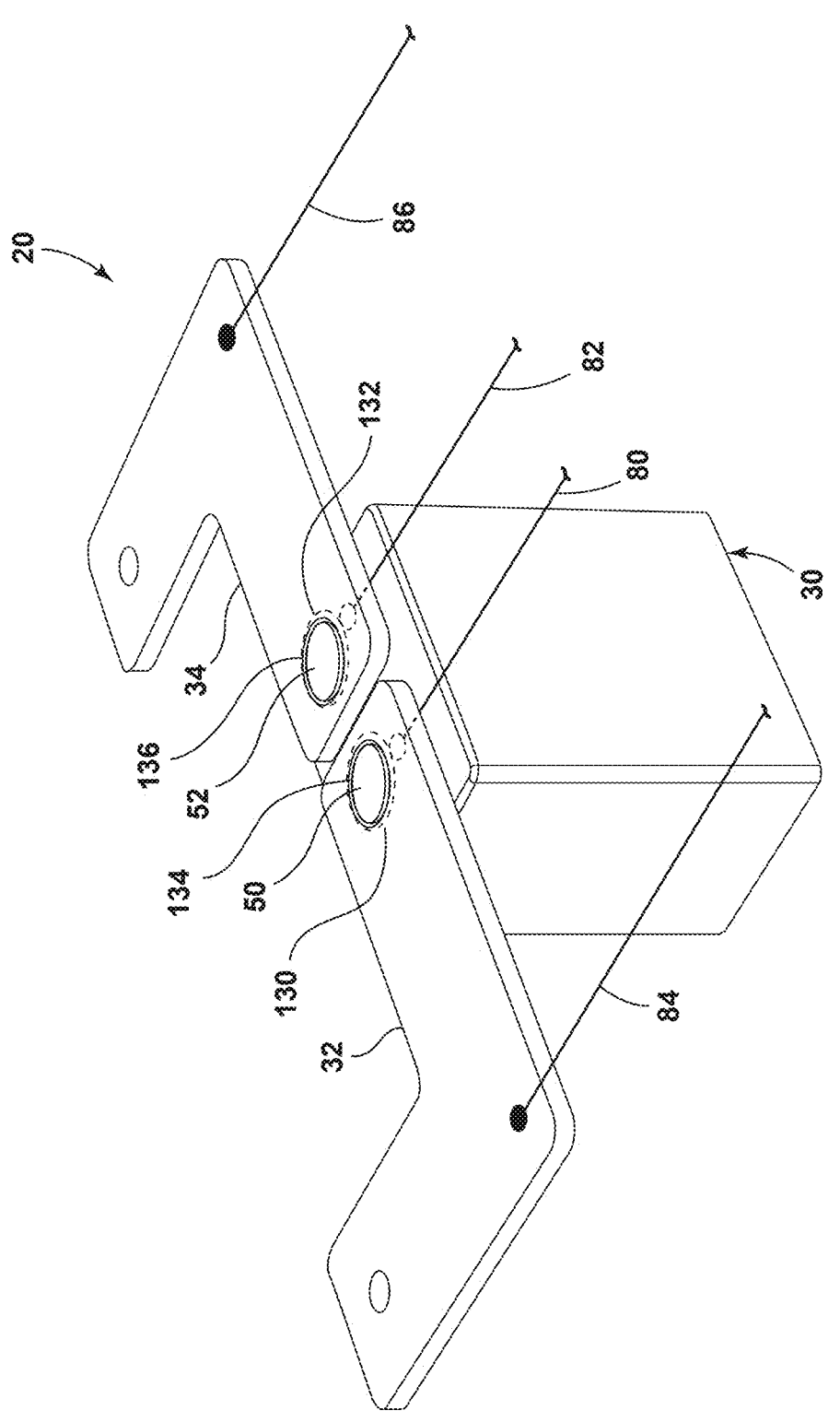
FIG. 3 is a perspective view generally illustrating portions of an embodiment of an electrical assembly according to teachings of the present disclosure.

Referring to FIGS. 2 and 3, the contactor 30, the first bus bar 32, the second bus bar 34, the first wire 80, the second wire 82, the third wire 84, and the fourth wire 86 are illustrated. The first wire 80 is connected to the first terminal 50 under the first bus bar 32. The second wire 82 is connected to the second terminal 52 under the second bus bar 34. The third wire 84 and the fourth wire 86 are connected to the first bus bar 32 and the second bus bar 34, respectively. Optionally, the third wire 84 and the fourth wire 86 are connected to the first bus bar 32 and the second bus bar 34 in other locations, or are connected to the first terminal 50 and the second terminal 52, respectively.

The first terminal 50 includes a first shoulder 130 and the second terminal includes a second shoulder 132. The first bus bar 32 includes a first aperture 134 and the second bus bar 34 includes a second aperture 136. The first bus bar 32 is connected (e.g., fixed, such as via laser welding) to the first terminal 50 such that the first bus bar 32 is disposed on the first shoulder 130 and the first terminal 50 extends into the first aperture 134. The second bus bar 34 is connected (e.g., fixed, such as via laser welding) to the second terminal 52 such that the second bus bar 34 is disposed on the second shoulder 132 and the second terminal 52 extends into the second aperture 136.

Figure 4:
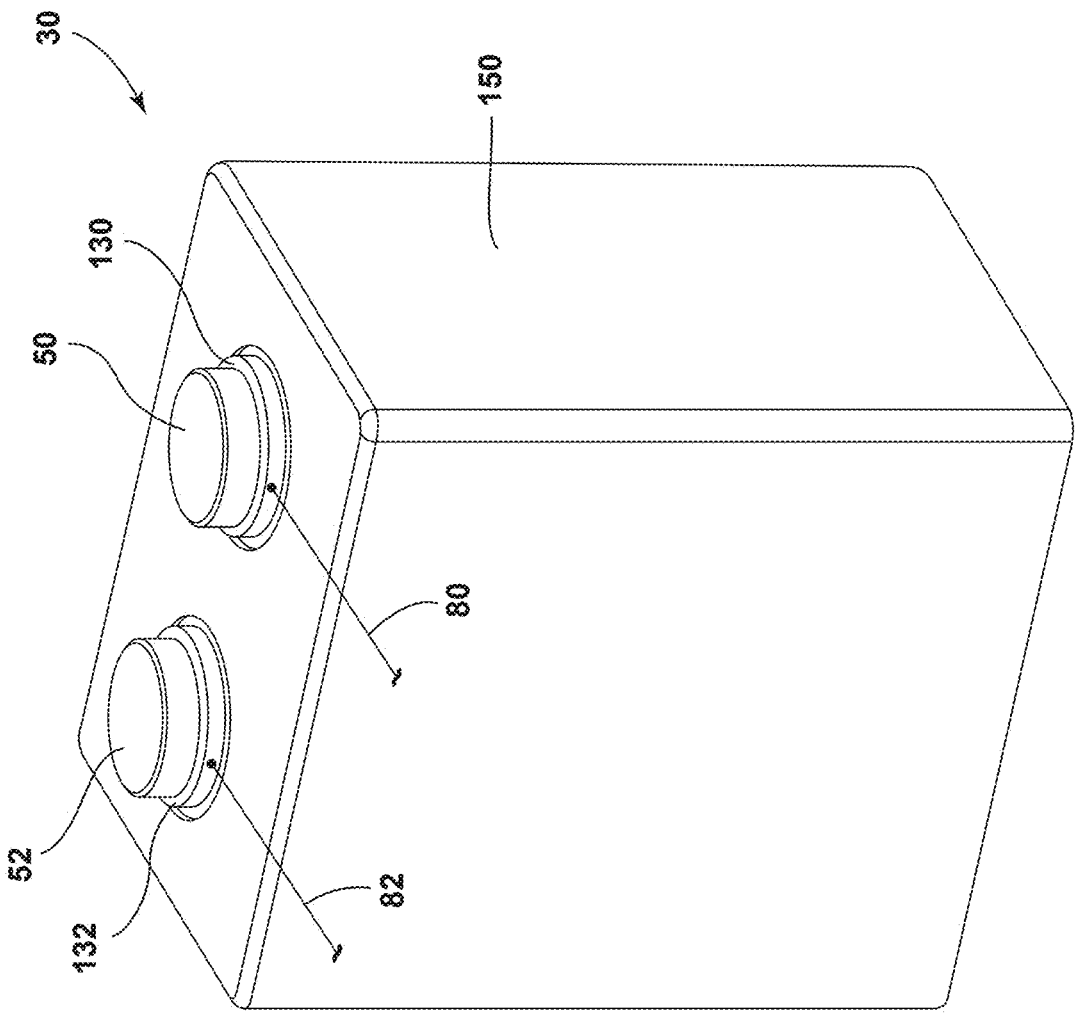
FIG. 4 is a perspective view generally illustrating portions of an embodiment of a contactor of an electrical assembly according to teachings of the present disclosure.
Figure 5:
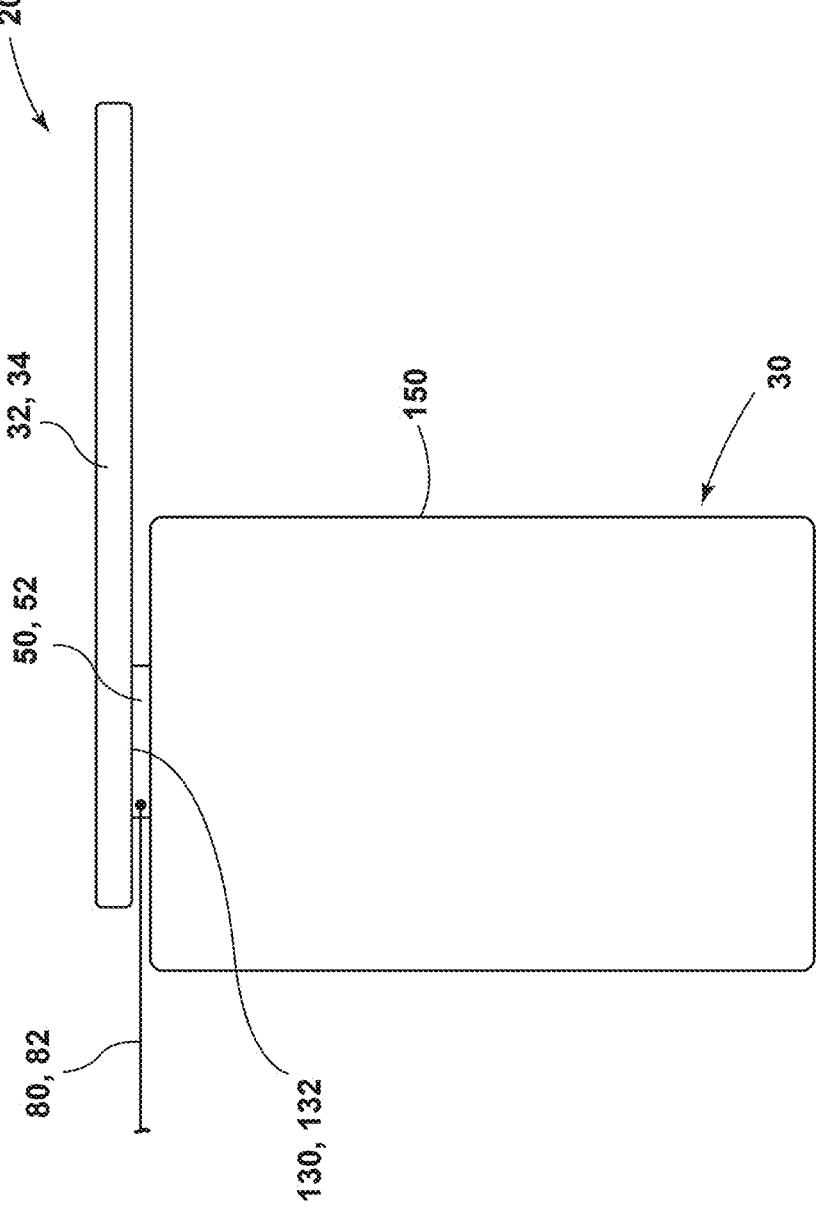
FIG. 5 is a side view generally illustrating portions of an embodiment of an electrical assembly according to teachings of the present disclosure.
Figure 6:
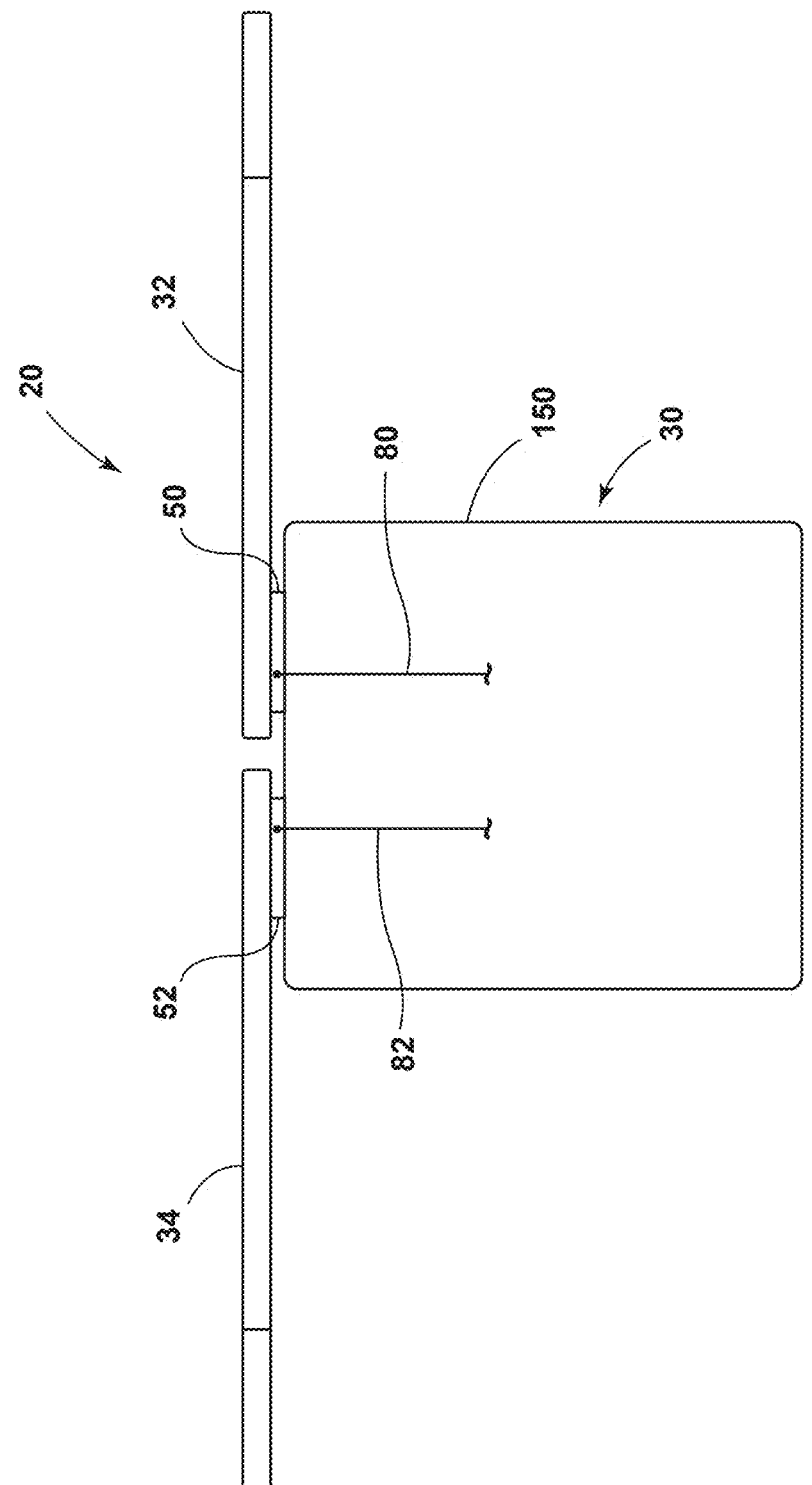
FIG. 6 is a side view generally illustrating portions of an embodiment of an electrical assembly according to teachings of the present disclosure.

Referring to FIGS. 4-6, the contactor 30 includes a housing 150. The first terminal 50 and the second terminal 52 extend from the housing 150. Optionally, the first terminal 50 and the second terminal 52 extend from the same side of the housing 150. The first terminal 50 and the second terminal 52 extend from the housing 150 such that the first shoulder 130 and the second shoulder 132 are spaced from the housing 150. As shown in FIG. 4, the first wire 80 is connected (e.g., fused, welded, etc.) to the first terminal 50 below (e.g., closer to the housing 150 than) the first shoulder 130. The second wire 82 is connected (e.g., fused, welded, etc.) to the second terminal 52 below (e.g., closer to the housing 150 than) the second shoulder 132. As shown in FIGS. 5 and 6, the first wire 80 is connected to the first terminal 50 between the first bus bar 32 and the housing 150 such that the first wire 80 does not interfere with and/or does not contact the first bus bar 32. The second wire 82 is connected to the second terminal 52 between the second bus bar 34 and the housing 150 such that the second wire 82 does not interfere with and/or does not contact the second bus bar 34.

Figure 7:
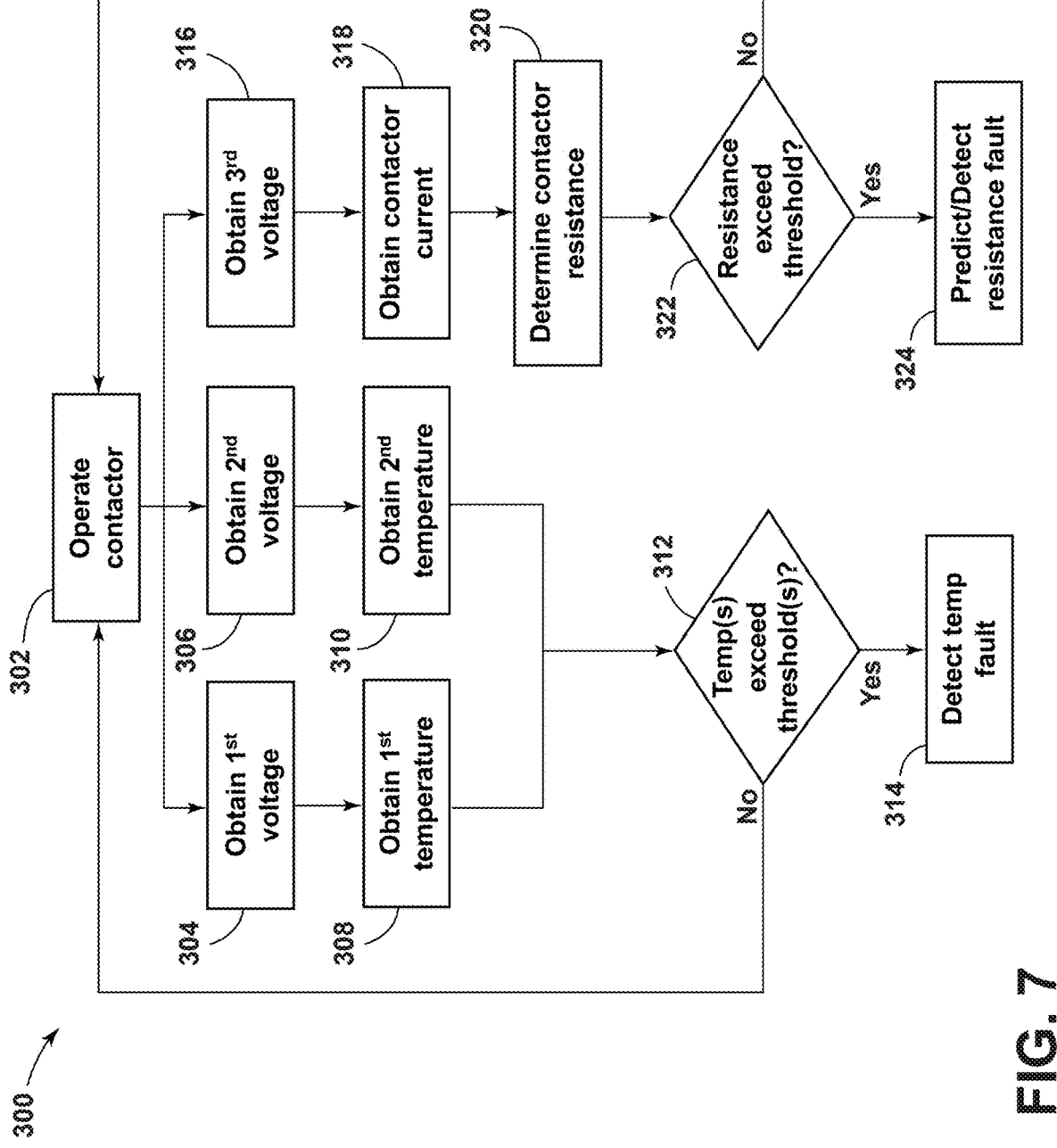
FIG. 7 is a flow diagram generally illustrating an embodiment of a method of operating an electrical assembly according to teachings of the present disclosure.

Referring to FIG. 7, a method 300 of operating the electrical assembly 20 is illustrated. The method can include operating the contactor 30 to selectively electrically connect the first terminal 50 with the second terminal 52 (block 302), which selectively electrically connects the first bus bar 32 with the second bus bar 34. With examples in which the electrical assembly 20 includes or is connected to the power source 60 and the electrical load 62, operating the contactor 30 selectively electrically connects the power source 60 with the electrical load 62.

The method 300 includes obtaining the first voltage across the first wire 80 and the third wire 84 (block 304), such as at the first amplifier 88. Obtaining the first voltage can include the first amplifier 88 amplifying the voltage across the first wire 80 and the third wire 84 and providing that amplified voltage to the electronic controller 100 as the first voltage.

The method 300 includes obtaining the second voltage across the second wire 82 and the fourth wire 86 (block 306), such as at the second amplifier 90. Obtaining the second voltage can include the second amplifier 90 amplifying the voltage across the second wire 82 and the fourth wire 86 and providing that amplified voltage to the electronic controller 100 as the second voltage.

The method 300 includes the electronic controller 100 determining the first temperature at the first terminal 50 according to the first voltage (block 308) and determining the second temperature at the second terminal 52 according to the second voltage (block 310). Optionally, determining the first temperature (block 308) and the second temperature (block 310) can include the controller 100 utilizing a look-up table to covert the first and second voltages to the first and second temperatures.

The method 300 includes the electronic controller 100 comparing the first temperature and the second temperature to the temperature threshold (block 312) and detecting a fault in response to determining that at least one of the first temperature or the second temperature exceeds the temperature threshold (block 314). The first temperature and/or the second temperature exceeding the temperature threshold can indicate an overcurrent condition of the contactor 30, and the detected fault can be the overcurrent condition. The temperature threshold can be predetermined and/or can correspond to a maximum expected current.

The method 300 includes obtaining, via the voltage sensor 92, the differential voltage (e.g., the third voltage) between the first wire 80 and the second wire 82 (block 316) and obtaining the contactor current (block 318). Obtaining the contactor current can include obtaining the contactor current from the current sensor 120 and/or from another source (e.g., a battery charger). The method 300 includes the electronic controller 100 determining the contactor resistance (block 320), such as via dividing the differential voltage by the contactor current. The method 300 includes comparing the contactor resistance to the contactor resistance threshold (block 322). The method 300 includes the electronic controller 100 predicting or detecting a resistance fault of the contactor 30 in response to determining that the contactor resistance exceeds the contactor resistance threshold (block 324). In some examples, the contactor resistance threshold can include be a first resistance at which a fault can be expected soon (e.g., the contactor 30 is operating at or near acceptable limits), so the electronic controller predicts the fault. Additionally or alternatively, the contactor resistance threshold can include a second resistance at which the contactor 30 is considered to have failed (e.g., the contactor 30 is not operating or is operating outside acceptable limits), and the electronic controller 100 detects the fault.

Some or all of the method 300 can be controlled and/or implemented, at least in part via the electronic controller 100. The first wire 80 and the second wire 82, which can be constantan wires, can be utilized for determining temperatures of the first and second terminals 50, 52, respectively, and also used for determining the contactor resistance. Some or all of the method 300 can, for example, be conducted during battery charging, such as via an external DC battery charger, which may provide the contactor current and/or a current measurement that can be used to calibrate the current sensor 120.

Utilizing the voltages obtained, at least in part, via the first wire 80 and/or the second wire 82 can be more reliable than other configurations as the thermal electromotive force (EMF) generated, at least in part, via the first wire 80 and/or the second wire 82 can be highly resistance to electromagnetic interference (EMI). Additionally or alternatively, connecting the first wire 80 directly to the first terminal 50 and connecting the second wire 82 directly to the second terminal 52 can allow for sensing the temperature at the first and second terminals 50, 52, which can be the highest or among the highest temperatures of the contactor 30 and the bus bars 32, 34. For example, with designs that measure temperatures only at bus bars, the measured temperatures can be lower than the temperatures at contactor terminals, which can result in not detecting or a delay in detecting faults, such as over current conditions. Embodiments of electrical assemblies 20 can obtain temperatures without thermistors, which can involve more wires, longer wires, additional power sources (e.g., a low voltage direct current power supply), and/or linearization, which can make thermistor designs more complicated, heavier, larger, and/or less responsive.

Welding the first wire 80 and the second wire 82 to the first and second terminals 42, 44 reduces thermal resistance and decrease response times, such as compared to an eyelet terminal sensor.

The instant disclosure includes the following non-limiting embodiments:

An electrical assembly, comprising: a contactor including a first terminal and a second terminal; a first bus bar connected to the first terminal; a second bus bar connected to the second terminal; a first wire connected to the first terminal; a second wire connected to the second terminal; a third wire connected to the first bus bar or the first terminal; a fourth wire connected to the second bus bar or the second terminal; a first amplifier connected to the first wire and the third wire; and a second amplifier connected to the second wire and the fourth wire; wherein the first wire and the second wire comprise a copper-nickel alloy.

The electrical assembly of any preceding embodiment, wherein the first bus bar, the second bus bar, the third wire, and the fourth wire comprise a material that is different than the copper-nickel alloy.

The electrical assembly of any preceding embodiment, wherein the first bus bar, the second bus bar, the third wire, and the fourth wire comprise copper.

The electrical assembly of any preceding embodiment, further comprising a controller electrically connected to outputs of the first amplifier and the second amplifier to determine a first temperature at the first terminal and a second temperature at the second terminal.

The electrical assembly of any preceding embodiment, further comprising a voltage sensor connected to the first wire and the second wire to sense a differential voltage across the first terminal and the second terminal.

The electrical assembly of any preceding embodiment, wherein the voltage sensor, the first amplifier, and the second amplifier are on the same chip.

The electrical assembly of any preceding embodiment, wherein the voltage sensor comprises a differential operational amplifier.

The electrical assembly of any preceding embodiment, wherein the controller is connected to the voltage sensor to determine a resistance of the contactor.

The electrical assembly of any preceding embodiment, further comprising a current sensor electrically connected to or disposed proximate the first bus bar or the second bus bar to sense an electrical current of the contactor.

The electrical assembly of any preceding embodiment, wherein the controller is configured to determine the resistance of the contactor according to an output of the voltage sensor and an outer of the current sensor.

The electrical assembly of any preceding embodiment, wherein the first terminal includes a shoulder; the first bus bar is disposed on the shoulder; and the first wire is connected to the first terminal below the shoulder.

The electrical assembly of any preceding embodiment, wherein the first wire is connected to the first terminal between the first bus bar and a housing of the contactor.

The electrical assembly of any preceding embodiment, wherein the first wire is welded to the first terminal.

A method of operating the electrical assembly of any preceding embodiment, the method comprising: operating the contactor to electrically connect the first terminal with the second terminal; obtaining a first voltage across the first wire and the third wire; determining a first temperature at the first terminal according to the first voltage difference; obtaining a second voltage across the second wire and the fourth wire; and determining a second temperature at the second terminal according to the second voltage difference.

The method of any preceding embodiment, further comprising comparing the first temperature and the second temperature with a temperature threshold; and detecting a fault in response to determining that at least one of the first temperature or the second temperature exceeds the temperature threshold.

The method of any preceding embodiment, further comprising obtaining, via a voltage sensor, a third voltage across the first wire and the second wire.

The method of any preceding embodiment, further comprising determining, via the electronic controller, a contactor resistance according to the third voltage difference and a contactor current.

The method of any preceding embodiment, further comprising obtaining, via a current sensor, the contactor current.

The method of any preceding embodiment, further comprising comparing the contactor resistance to a contactor resistance thresholding; and detecting a resistance fault in response to determining that the contactor resistance exceeds a contactor resistance threshold.

The method of any preceding embodiment, further comprising predicting a resistance fault in response to determining that the contactor resistance exceeds a contactor resistance threshold.

An electronic controller configured to implement the method of any preceding embodiment.

A non-transitory computer-readable storage medium having a computer program encoded thereon for implementing the method of any preceding embodiment.

In examples, a controller (e.g., the electronic controller 100) may include an electronic controller and/or include an electronic processor, such as a programmable microprocessor and/or microcontroller. In embodiments, a controller may include, for example, an application specific integrated circuit (ASIC) and/or an embedded controller. A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," "an embodiment," "with some configurations," "in some configurations," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," "an embodiment," "with some configurations," "in some configurations," or the like, in places throughout the specification are not necessarily all referring to the same embodiment. Furthermore, the particular features, structures, and/or characteristics may be combined in any suitable manner in one or more examples/embodiments. Thus, the particular features, structures, or characteristics illustrated or described in connection with one embodiment/ example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof. The word "exemplary" is used herein to mean "serving as a non-limiting example."

It should be understood that references to a single element are not necessarily so limited and may include one or more of such element, unless the context clearly indicates otherwise. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

"One or more" includes a function being performed by one element, a function being performed by more than one element, e.g., in a distributed fashion, several functions being performed by one element, several functions being performed by several elements, or any combination of the above. The term "at least one of" in the context of, e.g., "at least one of A, B, and C" or "at least one of A, B, or C" includes only A, only B, only C, or any combination or subset of A, B, and C, including any combination or subset of one or a plurality of A, one or a plurality of B, and one or a plurality of C.

Although the terms first, second, etc. are, in some instances, used herein to describe various elements, these elements should not be limited by these terms. These terms are only used to distinguish one element from another. For example, a first element could be termed a second element, and, similarly, a second element could be termed a first element, without departing from the scope of the various described embodiments. The first element and the second element are both elements, but they are not the same element.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. The term "and/or" as used herein refers to and encompasses any and all possible combinations of one or more of the associated listed items. Uses of "and" and "or" are to be construed broadly (e.g., to be treated as "and/or"). For example and without limitation, uses of "and" do not necessarily require all elements or features listed, and uses of "or" are inclusive unless such a construction would be illogical. The terms "includes," "including." "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples.

While processes, systems, and methods may be described herein in connection with one or more steps in a particular sequence, such methods may be practiced with the steps in a different order, with certain steps performed simultaneously, with additional steps, and/or with certain described steps omitted.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

All matter contained in the above description or shown in the accompanying drawings shall be interpreted as illustrative only and not limiting. Changes in detail or structure may be made without departing from the present disclosure.

A controller, an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

An article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical assembly, comprising:
   a contactor including a first terminal and a second terminal;
   a first bus bar connected to the first terminal;
   a second bus bar connected to the second terminal;
   a first wire connected to the first terminal;
   a second wire connected to the second terminal;
   a third wire connected to the first bus bar or the first terminal;
   a fourth wire connected to the second bus bar or the second terminal;
   a first amplifier connected to the first wire and the third wire; and
   a second amplifier connected to the second wire and the fourth wire;
   wherein the first wire and the second wire comprise a copper-nickel alloy.

2. The electrical assembly of claim 1, wherein the first bus bar, the second bus bar, the third wire, and the fourth wire comprise a material that is different than the copper-nickel alloy.

3. The electrical assembly of claim 2, wherein the first bus bar, the second bus bar, the third wire, and the fourth wire comprise copper.

4. The electrical assembly of claim 1, further comprising a controller electrically connected to outputs of the first amplifier and the second amplifier to determine a first temperature at the first terminal and a second temperature at the second terminal.

5. The electrical assembly of claim 4, further comprising a voltage sensor connected to the first wire and the second wire to sense a differential voltage across the first terminal and the second terminal.

6. The electrical assembly of claim 5, wherein the voltage sensor, the first amplifier, and the second amplifier are on the same chip.

7. The electrical assembly of claim 5, wherein the voltage sensor comprises a differential operational amplifier.

8. The electrical assembly of claim 5, wherein the controller is connected to the voltage sensor to determine a resistance of the contactor.

9. The electrical assembly of claim 8, further comprising a current sensor electrically connected to or disposed proximate the first bus bar or the second bus bar to sense an electrical current of the contactor.

10. The electrical assembly of claim 9, wherein the controller is configured to determine the resistance of the contactor according to an output of the voltage sensor and an outer of the current sensor.

11. The electrical assembly of claim 1, wherein the first terminal includes a shoulder;
   the first bus bar is disposed on the shoulder; and
   the first wire is connected to the first terminal below the shoulder.

12. The electrical assembly of claim 11, wherein the first wire is connected to the first terminal between the first bus bar and a housing of the contactor.

13. The electrical assembly of claim 12, wherein the first wire is welded to the first terminal.

14. A method of operating the electrical assembly of claim 1, the method comprising:

operating the contactor to electrically connect the first terminal with the second terminal;

obtaining a first voltage across the first wire and the third wire;

determining a first temperature at the first terminal according to the first voltage difference;

obtaining a second voltage across the second wire and the fourth wire; and determining a second temperature at the second terminal according to the second voltage difference.

15. The method of claim 14, further comprising comparing the first temperature and the second temperature with a temperature threshold; and detecting a fault in response to determining that at least one of the first temperature or the second temperature exceeds the temperature threshold.

16. The method of claim 14, further comprising obtaining, via a voltage sensor, a third voltage across the first wire and the second wire.

17. The method of claim 16, further comprising determining, via the electronic controller, a contactor resistance according to the third voltage difference and a contactor current.

18. The method of claim 17, further comprising obtaining, via a current sensor, the contactor current.

19. The method of claim 18, further comprising comparing the contactor resistance to a contactor resistance thresholding; and detecting a resistance fault in response to determining that the contactor resistance exceeds a contactor resistance threshold.

20. The method of claim 18, further comprising predicting a resistance fault in response to determining that the contactor resistance exceeds a contactor resistance threshold.

\* \* \* \* \*